United States Patent [19]
Sharma

[11] Patent Number: 5,249,086
[45] Date of Patent: Sep. 28, 1993

[54] H.D.A. PULSE SHAPING SYSTEM USING A DIFFERENTIAL DELAY LINE WITH MULTIPLE INPUTS

[75] Inventor: Man M. K. Sharma, Simi Valley, Calif.

[73] Assignee: Micropolis Corporation, Chatsworth, Calif.

[21] Appl. No.: 825,300

[22] Filed: Jan. 22, 1992

Related U.S. Application Data

[63] Continuation of Ser. No. 480,294, Feb. 15, 1990, abandoned.

[51] Int. Cl.$^5$ .......................... G11B 5/09; G11B 5/035
[52] U.S. Cl. ......................................... 360/45; 360/46; 360/65
[58] Field of Search .............................. 360/45, 46, 65

[56] References Cited

U.S. PATENT DOCUMENTS

| | | | |
|---|---|---|---|
| 3,252,098 | 5/1966 | Schlaepfer | 360/45 |
| 4,264,935 | 4/1981 | Lee | 360/45 |
| 4,319,288 | 3/1982 | Lee | 360/40 |
| 4,479,152 | 10/1984 | Chi | 360/46 |
| 4,786,989 | 11/1988 | Okamura et al. | 360/65 |
| 4,973,915 | 11/1990 | Batey | 330/151 |

Primary Examiner—Donald T. Hajec
Assistant Examiner—Won Tae C. Kim
Attorney, Agent, or Firm—Poms, Smith, Lande & Rose

[57] ABSTRACT

A system for slimming pulses which represent the data stored in a hard disk drive assembly. The pulse slimming system comprises a delay line with the pulse applied in one polarity to a central tap. The same pulse is applied in the opposite polarity to taps along the delay line on either side of the central tap. The pulses applied to either side of the central tap are controllably attenuated by amplifiers controlled by a microprocessor. The signal which is present at the output of the delay line is the sum of the original pulse with the attenuated pulses applied to either side of the central tap of the delay line subtracted from the leading and trailing edges of the pulse applied to the central tap.

13 Claims, 3 Drawing Sheets

H.D.A. PULSE SHAPING SYSTEM USING A DIFFERENTIAL DELAY LINE WITH MULTIPLE INPUTS

This is a continuation of copending U.S. application Ser. No. 07/480,294 filed on Feb. 15, 1990 now abandoned.

BACKGROUND OF THE INVENTION

1. Field of the Invention

This invention relates in general to pulse slimming, circuits, and in particular to slimming the pulses which are generated when data is read from the storage disks of a hard disk drive.

2. Description of the Related Art

In the hard disk drive digital storage art, an information bearing signal in the form of write current pulses passes through a write head and induces a corresponding magnetic pattern on the hard disk moving under the head. The hard disk maintains its magnetization which constitutes stored digital information. Read back is the process in reverse: the magnetization on the disk (platter) induces varying electric currents in a read head.

As computer programs and applications demand ever increasing amounts of memory, the density of data to be stored on each disk or platter within a hard disk drive and the rate at which that information can be stored and read is ever increasing. As storage density and data rates increase, interference between pulses and other related problems grow worse.

Some past patents have modified the spectral contour of the signal after it has been read back from the hard disk to compensate for changes due to temperature variations in the environment in which the hard disk drive is operating. U.S. Pat. No. 4,479,152 to Chi issued Oct. 23, 1984 shows such a system. The Chi patent subtracts a single delayed and amplitude modified signal from the original signal in order to compensate for changes of temperature, pressure or other conditions. The amount of delay and amplitude modification can be varied among a fixed set of choices according to the physical conditions in which the hard disk drive is operating.

However, such simple systems provide quite limited improvements in performance. What is needed is a more sophisticated system for more effectively slimming the data pulses so that greater storage densities and data rates can be utilized.

SUMMARY OF THE INVENTION

A principal object of the present invention is to provide a circuit which slims the pulses read from a hard disk drive so that greater data density storage and higher read rates are possible.

The present invention includes a delay line having a plurality of input taps along its length. Arrangements for supplying a pulse from a magnetic medium to an intermediate point along the delay line are also provided. The same pulse is also applied in the opposite polarity to the delay line at taps on either side of the intermediate point.

The attenuation or weight of the pulses which are applied to either side of the intermediate point on the delay line can be varied by a control circuit. The control circuit varies the weight of the pulses applied to either side of the intermediate point according to various factors, for example, depending on the platter and track where the pulse originated.

The signals which are applied "behind" the intermediate point subtract from the trailing edge of the pulse applied at the intermediate point along the delay line. The signals which are applied "ahead" of the intermediate point subtract from the leading edge of the signal applied at the intermediate point. The resultant signal from the delay line is therefore a slimmed version of the pulse which was read from the disk.

Other objects, features and advantages of the invention will become apparent from a consideration of the following detailed description, and from the accompanying drawings.

BRIEF DESCRIPTION OF THE DRAWINGS

FIG. 3 shows a pulse prior to modification and the pulse after slimming; and

DESCRIPTION OF THE PREFERRED EMBODIMENT

Figure 1:
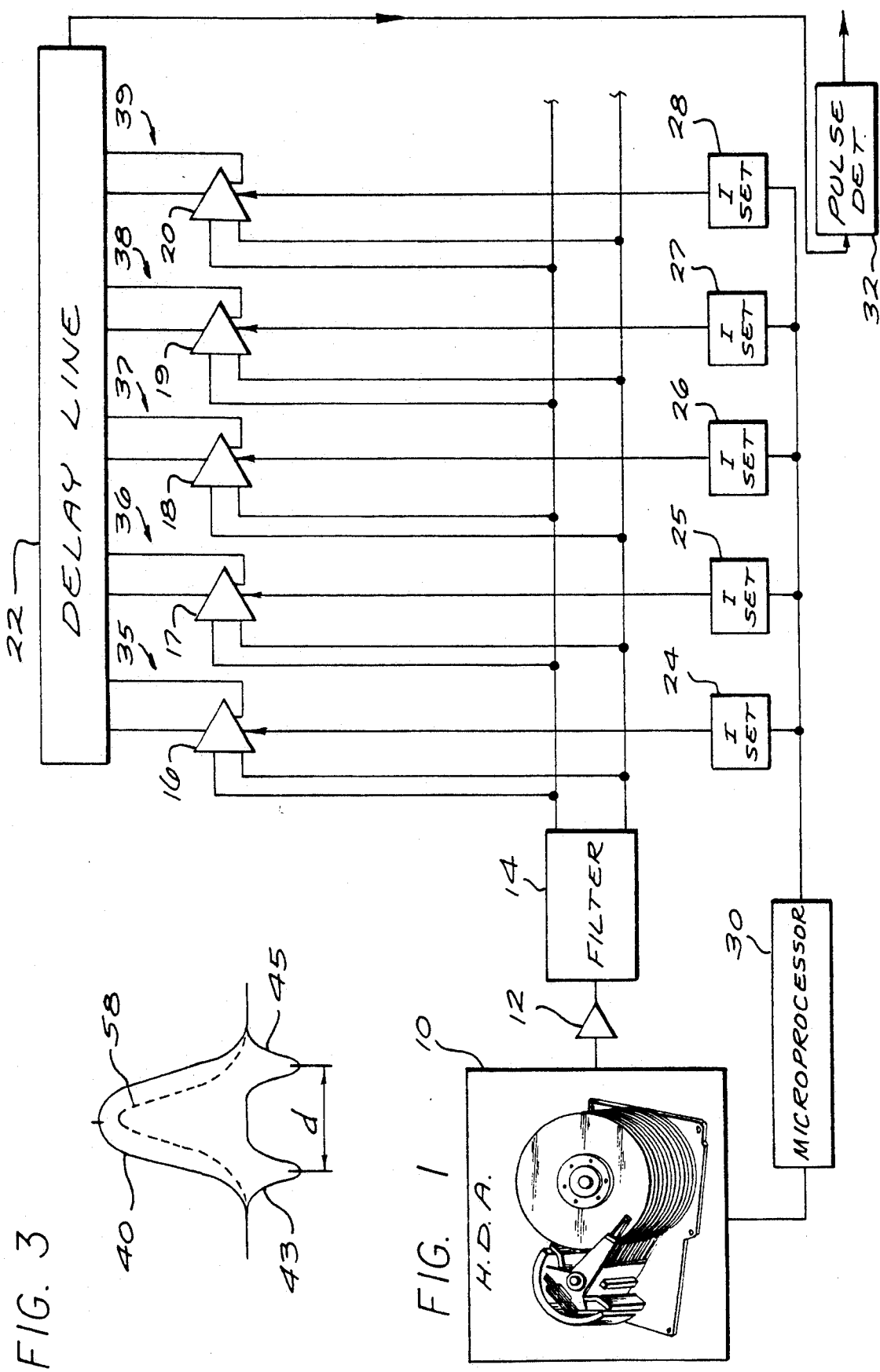
FIG. 1 shows a preferred embodiment of the present invention in a schematic form.

Referring to the drawings, and more particularly, to FIG. 1, a preferred embodiment of the present invention is shown. The circuit illustrating the invention receives a signal from a hard disk drive assembly (H.D.A.) 10. The H.D.A. 10 may include a plurality of hard disks, a head positioning mechanism, and magnetic heads attached to the outer ends of the head positioning arms. Pulses are read from the hard disks by the magnetic heads and the pulse or signal is transmitted to an amplifier 12, which may be located at the base of each head positioning arm. The pulse is then applied to the filter 14.

The circuitry for applying the pulse in one polarity to an intermediate point along the delay line 22 and for applying the same pulse in the opposite polarity to the delay line at points on either side of the intermediate point is implemented in the following manner. From the filter 14 the pulse is applied to amplifier circuitry. The amplifier circuitry of FIG. 1 comprises a plurality of amplifiers 16 through 20. The pulse is applied in one polarity to the amplifier in a central position, amplifier 18, and in the opposite polarity to the remaining amplifiers 16, 17 and 19, 20. The signal is then fed into the delay line 22 at taps 35 through 39.

The microprocessor 30 adjusts the amplification of amplifiers 16 through 20 according to various factors. For example, the levels of the pulses may be varied according to the track and disk from which the pulse originates and in accordance with the characteristics of the associated read head. The microprocessor sends a control signal to the "I-set" circuitry for each amplifier 16 through 20, with the I-set circuits being designated 24, through 28. The I-set circuits 24–28 then generate control currents according to the control signal from the microprocessor. The level of the control current from each I-set circuit determines the output level from the associated amplifier.

Figure 2:
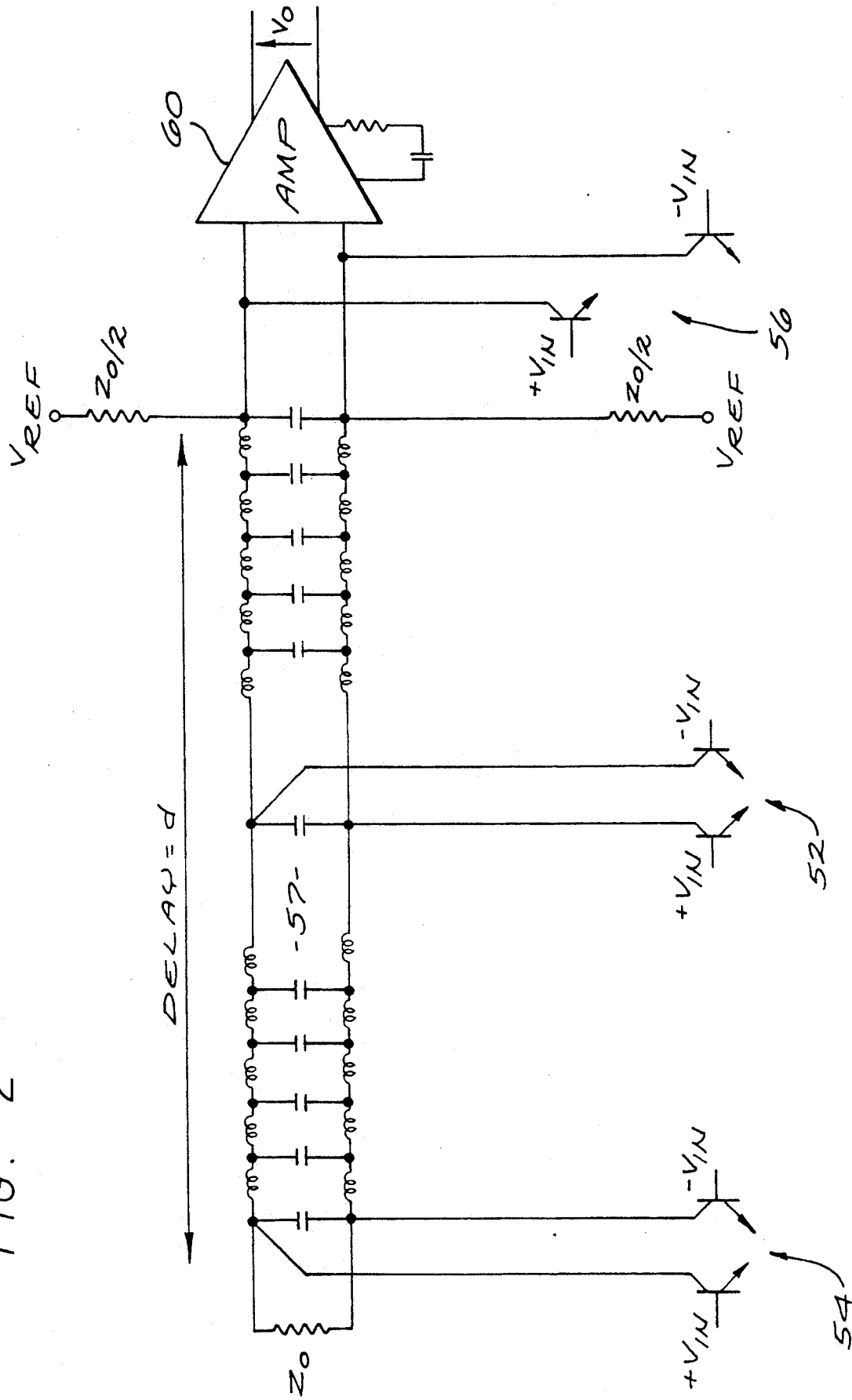
FIG. 2 is an electrical schematic circuit diagram of one alternative embodiment of the present invention depicted at a point in time.

FIG. 2 is an electrical schematic circuit diagram of one embodiment of the present invention at a certain point in time. The output from filter 14 (shown in FIG. 1) is applied with the indicated polarities to the inputs labeled Vin indicated as 52, 54, and 56. The signal associated with input 52 is applied at one polarity and the signals associated with inputs 54 and 56, the subtraction terms, are applied to the differential or balanced delay line 57 (represented by the capacitive inductive network with its characteristic impedance, 20, at each end) in the opposite polarity.

The total delay of the delay line, from input 54 to the end of the delay line is indicated as d. With input 52 located in the center of the delay line, the delay from input 52 to the output of the delay is ½ d. The signal associated with input 54 is delayed ½ d relative to the signal associated with input 52. The signal associated with input 56 is advanced ½ d with respect to the signal associated with input 52 when looking at the output of the delay line 57.

FIG. 3 shows, with respect to a single pulse, the slimmed output pulse 58, V-out of FIG. 2 as a dashed line. The solid line pulse 40 represents the signal associated with input 52 in FIG. 2 and the negative going solid line pulse 43 represents the signal associated with input 54 and the negative going pulse 45 represents the signal associated with input 56. These signals are summed at the input to the amplifier 60 as shown in FIG. 2. The amplifier 60 is acting as a buffer. The resulting signal V-out is represented by the dashed line 58. Indicated in FIG. 3, the resulting pulse is a slimmer version of the original pulse. Slimmer pulses permit more pulses per time period. Slimming the pulse in this manner allows for higher data read rates and higher storage density on the disks.

Figure 4:
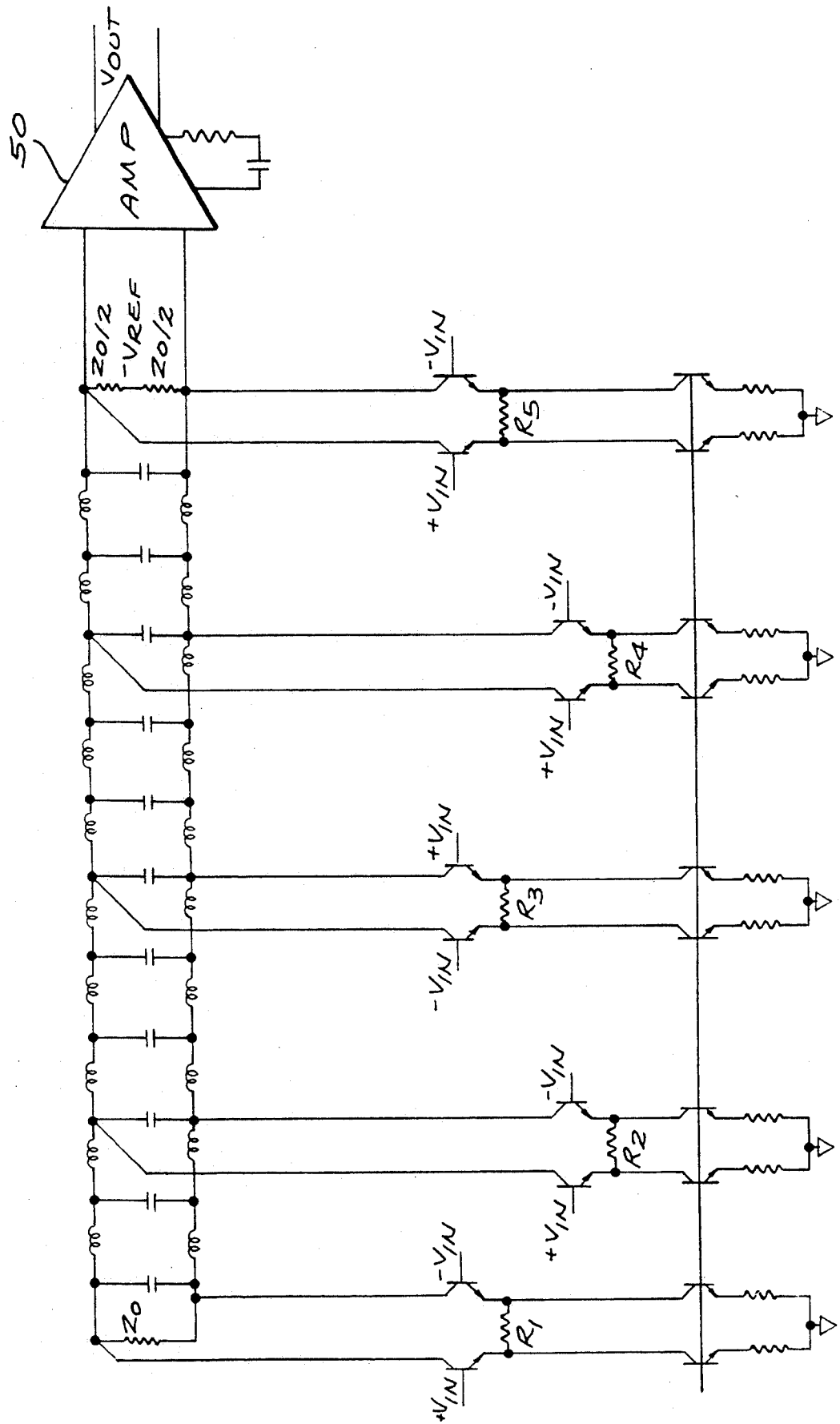
FIG. 4 is an electrical schematic circuit diagram of another embodiment of the present invention, at a certain point in time.

FIG. 4 is an electrical schematic circuit diagram of another embodiment of the present invention at a certain point in time. The output from the filter 14 of FIG. 1 is applied with the indicated polarities to the inputs labeled Vin. Resistors R1 through R5 determine the weight or attenuation of each pulse which is applied to the delay line (indicated in FIG. 4 as a system of capacitors and inductors with its characteristic impedance, Zo, at each end). The circuitry located below resistors R1 through R5 is for biasing.

The signal associated with resistor R3 is applied at one polarity and the signals associated with resistors R1, R2, R4 and R5, the subtraction terms, are applied to the delay line in the opposite polarity. The attenuated signals associated with resistors R1 and R2 are delayed relative to the signal associated with resistor R3 and the signals associated with resistors R4 and R5 are advanced with respect to the signal associated with resistor R3. The embodiment shown in FIG. 4 is more complex than that of FIG. 2 and would provide improved pulse slimming.

In a hard disk drive, data is typically stored more densely on the inner tracks of a disk than on the disks outer tracks. As one application of the present invention, the microprocessor 30 (see FIG. 1) would vary the weight of the pulses applied to taps 35, 36, 38, and 39 (subtraction terms) according to the track from which the data was being read. The weight of the subtraction terms would be increased when an inner track densely packed with data is being read because the data pulses would be more closely spaced. Therefore, greater slimming would be required in order to eliminate interference between pulses and to allow for more accurate pulse detection.

When outer, less densely packed, tracks are read, the weight of the subtraction terms could be decreased because the data pulses would be further spaced apart. Interference between pulses would be less and pulse detection would be more accurate. Therefore, less slimming would be required. The optimum weight for each subtraction term at each track could be predetermined. Those values could be utilized by the microprocessor as data from a particular track is read.

Similarly, varying the weights of the subtraction terms could also compensate for the varying characteristics of the read heads. Also, other factors which effect the data pulses such as temperature and humidity could be compensated for by the present invention.

It should be noted that the present invention is not limited to the embodiments shown. By way of example and not limitation, various alternative embodiments within the scope of this invention will be briefly mentioned. Various electronic means may be utilized to attenuate the subtraction terms. Various numbers of taps on the delay line and means for applying pulses to the delay line could be used. Multiple inputs to the delay line could be controlled by a single amplifier. Instead of attenuating the subtraction terms, the pulse applied to the intermediate position could be amplified or a combination of attenuation and amplification could be utilized. All of the named variations and others that one of ordinary skill in the art would know of are believed to be within the scope of the present invention.

I claim:

1. A pulse slimming system comprising:

A hard disk drive assembly;

a differential delay line having two parallel systems of inductors with a plurality of input taps along its length wherein each input tap includes a first input and a second input, said first input being an input to one of said two parallel systems of inductors and said second input being an input to the other of said two parallel systems of inductors;

means for differentially applying a pulse from said hard disk drive assembly to an intermediate tap along said delay line;

means for differentially applying said pulse in the opposite polarity to taps on both sides of said intermediate tap;

amplifier means for controllably modifying the amplitude of each pulse applied to said delay line; and a microprocessor for controlling the amplitude modification of said amplifier means.

2. A pulse slimming system as defined in claim 1 wherein said microprocessor controls the amplitude modification of said amplifier means in response to the platter and track from which the pulse originates.

3. A pulse slimming system as defined in claim 1 wherein said amplifier means includes a plurality of amplifiers, one associated with each said tap, control means for applying biasing electrical signals to each said amplifier to establish the gain of each said amplifier, and means for coupling signals from said microprocessor to each said control means, to thereby establish the gain of each said amplifier.

4. A pulse slimming system as defined in claim 1 wherein said pulse is applied to three successive points along said delay line, including a first point, a second intermediate point, and a third point, with said first and third points being on opposite sides of said intermediate point.

5. A pulse slimming system as defined in claim 1 wherein said system includes means for applying said pulse differentially to five successive points along said delay line, including first and second points, a third intermediate point, and forth and fifth points, said first and second points being on one side and said forth and fifth points being on the opposite side of said intermediate point.

6. A pulse slimming system comprising:
a hard disk drive assembly;
a differential delay line having two parallel systems of inductors with a plurality of input taps along its length wherein each input tap includes a first input and a second input, said first input being an input to one of said two parallel systems of inductors and said second input being an input to the other of said two parallel systems of inductors;
means for differentially applying a pulse from said hard disk drive assembly to an intermediate tap along said delay line and at a predetermined amplitude level;
means for differentially applying said pulse in the opposite polarity to taps on both sides of said intermediate point at reduced amplitude levels as compared with said predetermined amplitude level and displaced along said delay line to effectively reduce the amplitude of the leading and trailing portions of the pulse applied to said intermediate tap; and
amplifier means for controllably modifying the amplitude of each pulse applied to said delay line;
whereby the pulse applied to said delay line are combined in said delay line.

7. A pulse slimming circuit for use in a digital storage system which includes a hard disk drive assembly, said circuit comprising:
A differential delay line having two parallel systems of inductors with a plurality of input taps along its length wherein each input tap includes a first input and a second input, said first input being an input to one of said two parallel systems of inductors and said second input being an input to the other of said two parallel systems of inductors;
means for differentially applying a pulse from said hard disk drive assembly to an intermediate tap along said delay line and at a predetermined amplitude level; and
means for differentially applying said pulse in the opposite polarity to taps on both sides of said intermediate point at reduced amplitude levels as compared with said predetermined amplitude level and displaced along said delay line to effectively reduce the amplitude of the leading and trailing portions of the pulse applied to said intermediate tap;
whereby the pulses applied to said delay line are combined in said delay line.

8. A pulse slimming circuit as defined in claim 7, including amplifier means for controllably modifying the amplitude of each said pulse applied to said delay line.

9. A pulse slimming circuit as defined in claim 8, further including a microprocessor for controlling the amplitude modification of said amplifier means.

10. A pulse slimming circuit for use in a digital storage system which includes a hard disk drive assembly, said circuit comprising:
A differential delay line having two parallel systems of inductors with a plurality of input taps along its length wherein each input tap includes a first input and a second input, said first input being an input to one of said two parallel systems of inductors and said second input being an input to the other of said two parallel systems of inductors;
means for differentially applying a pulse from said hard disk drive assembly to an intermediate tap along said delay line;
means for differentially applying said pulse in the opposite polarity to taps on both sides of said intermediate point at reduced amplitude levels as compared with the amplitude level of the pulse applied to said intermediate tap and displaced along said delay line to effectively reduce the amplitude of the leading and trailing portions of the pulse applied to said intermediate tap; and
a microprocessor for controlling the amplitude levels of each said pulse applied to said delay line.

11. A pulse slimming circuit as defined in claim 10, including amplifier means for controllably modifying the amplitude of each pulse applied to said delay line.

12. A pulse slimming circuit as defined in claim 11, wherein said amplifier means includes a plurality of amplifiers, one associated with each said tap, control means for applying biasing electrical signals to each said amplifier to establish the gain of each said amplifier, and means for coupling signals from said microprocessor to each said control means, to thereby establish the gain of each said amplifier.

13. A pulse slimming system as defined in claim 11, wherein said microprocessor controls the amplitude modification of said amplifier means in response to the platter and track from which the pulse originates.

* * * * *